United States Patent [19]
Wright

[11] Patent Number: 5,050,085
[45] Date of Patent: Sep. 17, 1991

[54] ENGINE CONTROL MICROPROCESSOR START-UP CIRCUIT

[75] Inventor: Danny O. Wright, Newport News, Va.

[73] Assignee: Siemens Automotive L.P., Auburn Hills, Mich.

[21] Appl. No.: 542,300

[22] Filed: Jun. 22, 1990

[51] Int. Cl.⁵ .............................................. H03B 5/36
[52] U.S. Cl. .......................... 364/431.11; 364/431.04; 123/479; 331/158; 331/116 FE; 310/318
[58] Field of Search ............ 331/158, 116 R, 116 FE, 331/63; 368/203, 204, 156; 310/318; 307/269, 271; 364/431.04; 431.11; 123/479

[56] References Cited

U.S. PATENT DOCUMENTS

| | | | |
|---|---|---|---|
| 3,373,379 | 6/1966 | Black | 331/158 |
| 3,838,566 | 10/1974 | O'Connor et al. | 331/116 FE X |
| 3,978,650 | 9/1976 | Hashimoto et al. | 331/116 R X |
| 4,704,587 | 11/1987 | Ouyang et al. | 331/158 X |

Primary Examiner—Kevin J. Teska
Assistant Examiner—Thomas S. Auchterlonie
Attorney, Agent, or Firm—George L. Boller; Russel C. Wells

[57] ABSTRACT

The crystal-controlled oscillator circuit of the microprocessor comprises, for the starting resistance, a pair of discrete resistors connected in parallel. The two have respective resistance values which in their parallel circuit connection are effective to cause the initiation of electrical oscillation and which are also individually effective to cause the initiation of electrical oscillation so that in the event that one of the individual resistors experiences an open circuit fault, the oscillation can nonetheless be initiated by the other of the individual resistors. The invention provides improved reliability for automotive vehicle engine control systems.

18 Claims, 1 Drawing Sheet

ENGINE CONTROL MICROPROCESSOR START-UP CIRCUIT

BACKGROUND AND SUMMARY OF THE INVENTION

This invention relates to a microprocessor-based engine control system and in particular to the circuit that generates a crystal-controlled electrical oscillation from which the microprocessor's clock signal is developed.

Microprocessor-based control systems can be advantageously employed to control certain functions of an automotive vehicle internal combustion engine. Fuel control, ignition control, and throttle control are examples. The improvement of system reliability is a constant objective of conscientious automotive electronic engineers. The present invention has arisen in consequence of the inventor's efforts toward this goal.

Conventional automotive electronic microprocessor technology is configured to utilize a crystal-controlled oscillator to develop the microprocessor's clock signal. The crystal is disposed in external circuitry external to the microprocessor itself, but electrically connected in circuit relation with certain internal circuitry of the microprocessor. These combined circuitries cooperatively form the crystal-controlled oscillator. In order to start the oscillator when the microprocessor is powered-up, a starting resistor of appropriate ohmage and wattage is electrically connected in the external circuitry that contains the crystal.

In seeking improved system reliability, the inventor has recognized that the occurrence of an open-circuit fault in the starting resistor will prevent the oscillator circuit from being started when the microprocessor is powered-up. The consequence is that the microprocessor clock signal cannot be generated and the microprocessor therefore will not operate. In other words the control system will not function.

The inventor proposes to obtain improved reliability against the open-circuit failure of the oscillator starting resistor by what in hindsight is a surprisingly simple means. Rather than embodying the oscillator starting resistor as a single discrete device, it is made to comprise two discrete devices, which in the disclosed preferred embodiment, are two parallel resistors of substantially identical resistance. The relationship is such that 1) the equivalent resistance of the parallel combination of the two discrete resistors is a value that is effective to initiate electrical oscillation of the crystal-controlled oscillator, and 2) the resistance of each single one of the two discrete resistors is effective to also initiate electrical oscillation of the crystal-controlled oscillator so that an open-circuit fault in either one of the two will not prevent the oscillator circuit from being started into oscillation. In other words, open circuit faults must be simultaneously present in both discrete resistors to constitute a disabling fault in the start-up resistance. Accordingly, the reader can readily perceive that improved reliability is attained.

A detailed disclosure will be given in the ensuing description of a presently preferred embodiment constructed in accordance with the best mode presently contemplated for carrying out the invention. A drawing accompanies the disclosure.

DESCRIPTION OF THE PREFERRED EMBODIMENT

Figure 1:
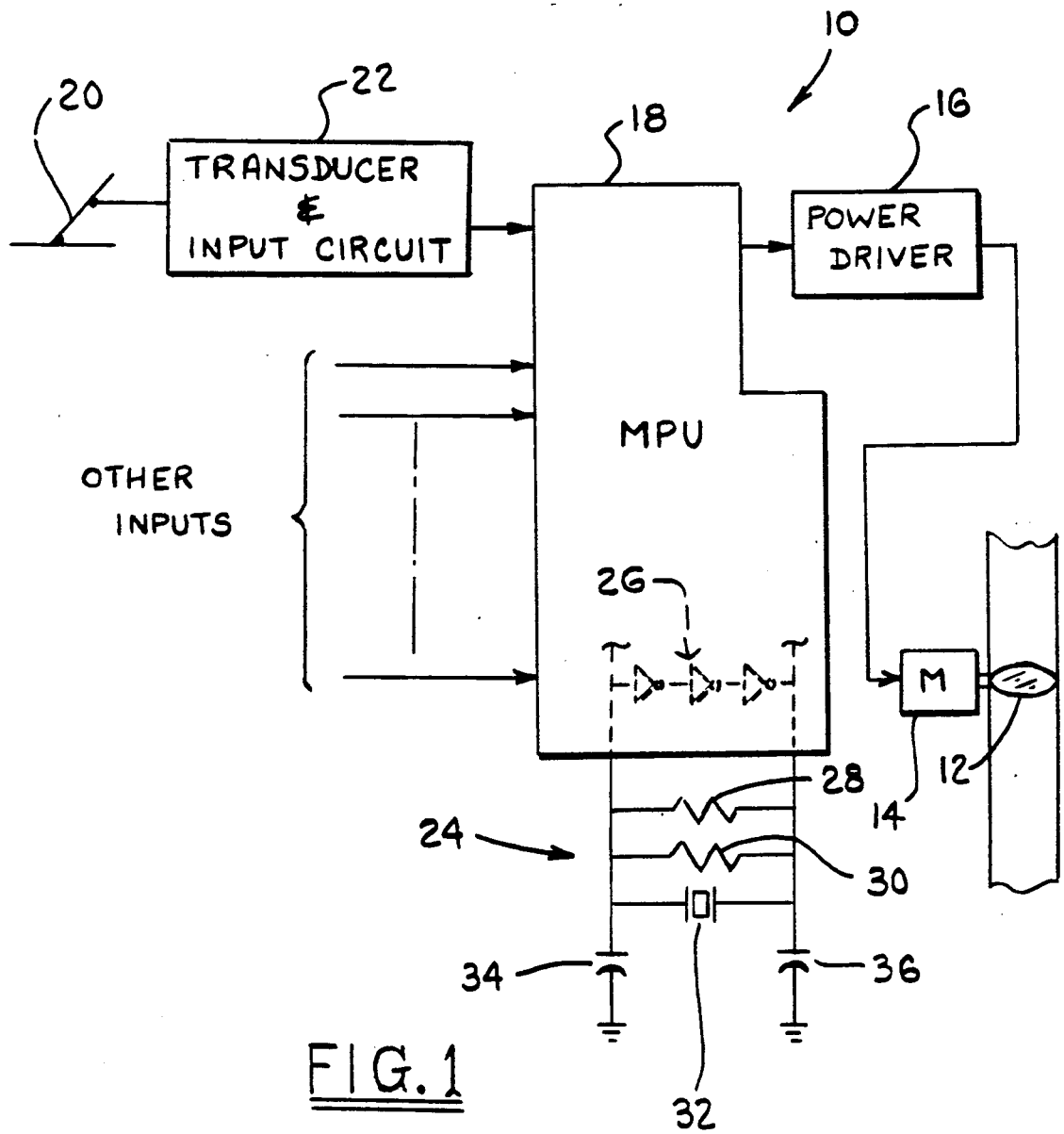
FIG. 1 is a schematic diagram of an exemplary automotive engine control system which has a microprocessor-based configuration including circuitry embodying principles of the invention.

The exemplary control system is an electronic throttle control system 10 of the type disclosed in commonly assigned U.S. Pat Nos. 4,850,319; 4,855,660; and 4,869,220. The automotive vehicle which contains the system comprises an internal combustion engine whose throttle 12 is operated by an electric stepper motor 14. Motor 14 is itself operated by a power driver circuit 16 under the control of a microprocessor (MPU) 18. In automotive uses, MPU 18 is advantageously fabricated through the use of CMOS technology.

There are a number of inputs to MPU 18, one of which is from the vehicle's accelerator pedal 20 under the control of the driver of the vehicle. A suitable transducer and input circuit 22 delivers an input command signal to a particular input of MPU 18. This signal represents a desired positioning of the valve of throttle 12, as commanded by pedal 20. MPU 18 is programmed in accordance with an algorithm to develop an appropriate output signal for delivery to circuit 16 for operating throttle 12. The algorithm takes into account certain other inputs to MPU 18 which are derived from various sensors, or transducers, other than the sensor which forms a part of the structure referenced at 22.

MPU 18 is a conventional device, a 68HC11 for example. It contains certain internal circuitry which cooperates with certain external circuitry 24 to form a crystal-controlled oscillator circuit from which the microprocessor's clock signal is developed. A portion of the internal circuitry of the oscillator circuit is shown in phantom and designated 26. External circuitry 24 comprises resistors 28, 30, a crystal 32, and capacitors 34, 36 connected as illustrated.

The two resistors 28, 30 constitute the oscillator starting resistance in accordance with principles of the invention. In the prior art construction, there was only a single resistor; an open-circuit fault in it would prevent the oscillator from starting when the microprocessor was powered-up. For example, the prior single resistor of a particular embodiment was 10 megohms; in the present invention it is replaced by two parallel 20 megohm resistors. The resistors 28, 30 have respective resistance values which in their parallel circuit relationship connection are effective to cause the initiation of electrical oscillation in the oscillator circuit and which are also individually effective to cause the initiation of the electrical oscillation so that in the event that one of the two individual resistors experiences an open circuit fault, the oscillation can nonetheless be initiated by the other of the two individual resistors. The microprocessor comprises a pair of terminals to which the external circuitry portion of the oscillator is connected, and each discrete resistor 28, 30 is connected directly between the pair of microprocessor terminals.

It is fully contemplated that principles of the invention can be practiced in other equivalent ways, and therefore while a presently preferred embodiment and an exemplary usage of the invention have been disclosed, it should be appreciated that the broader inventive principles are not limited to the specific circuit configuration illustrated in the drawing.

What is claimed is:

1. In an internal combustion engine powered automotive vehicle having an electromechanically operated engine throttle mechanism of the type wherein an input means comprising a transducer which is operated by the vehicle's driver delivers an input command signal to a microprocessor-based control, the microprocessor delivers a throttle command signal to an output means comprising an electromechanical prime mover which operates the throttle mechanism, the microprocessor receives one or more other input signals from other input means, the microprocessor is programmed to develop the throttle command signal in accordance with an algorithm which utilizes information derived from said input command signal and said one or more other input signals, and the microprocessor comprises internal circuitry which is connected with external circuitry that includes the parallel circuit combination of a crystal and a starting resistance configured to initiate and sustain electrical oscillation of the combined circuitries and cause the generation of an internal clock signal within the microprocessor at a frequency related to said electrical oscillation, the improvement which comprises said starting resistance comprising two individual resistance means connected in parallel circuit relationship with each other and directly connected to said microprocessor internal circuitry, said two individual resistance means having respective resistance values which in their parallel circuit relationship connection are effective to cause the initiation of said electrical oscillation in the combined circuitries and which are also individually effective to cause the initiation of said electrical oscillation in the combined circuitries so that in the event that either one of said individual resistance means experiences an open circuit fault, said oscillation can nonetheless be initiated and sustained by the other of said individual resistance means.

2. The improvement set forth in claim 1 wherein said individual resistance means each comprises a single discrete resistor.

3. The improvement set forth in claim 2 wherein the single discrete resistor of said one resistance means has a resistance value which is substantially equal to that of the single discrete resistor of said other resistance means.

4. The improvement set forth in claim 1 wherein said one resistance means has a resistance value which is substantially equal to that of said other resistance means.

5. The improvement set forth in claim 1 wherein said microprocessor is of the CMOS type and comprises a pair of terminals to which said external circuitry is connected, said individual resistance means each comprises a single discrete resistor, and each resistor is connected directly between said pair of terminals.

6. The improvement set forth in claim 5 wherein the single discrete resistor of said one resistance means has a resistance value which is substantially equal to that of the single discrete resistor of said other resistance means.

7. In an internal combustion engine powered automotive vehicle having a microprocessor-based control, one or more input means for delivering one or more input signals to the microprocessor, and one or more output means via which one or more output signals from the microprocessor exercises control over one or more aspects of engine operation, and wherein the microprocessor is programmed to develop the one or more output signals in accordance with an algorithm which utilizes information derived from said one or more input signals, and the microprocessor comprises internal circuitry which is connected with external circuitry that includes the parallel circuit combination of a crystal and a starting resistance configured to initiate and sustain electrical oscillation of the combined circuitries and cause the generation of an internal clock signal within the microprocessor at a frequency related to said electrical oscillation, the improvement which comprises said starting resistance comprising two individual resistance means connected in parallel circuit relationship with each other and directly connected to said microprocessor internal circuitry, said two individual resistance means having respective resistance values which in their parallel circuit relationship connection are effective to cause the initiation of said electrical oscillation and which are also individually effective to cause the initiation of said electrical oscillation so that in the event that either one of said individual resistance means experiences an open circuit fault, said oscillation can nonetheless be initiated and sustained by the other of said individual resistance means.

8. The improvement set forth in claim 7 wherein said individual resistance means each comprises a single discrete resistor.

9. The improvement set forth in claim 8 wherein the single discrete resistor of said one resistance means has a resistance value which is substantially equal to that of the single discrete resistor of said other resistance means.

10. The improvement set forth in claim 7 wherein said one resistance means has a resistance value which is substantially equal to that of said other resistance means.

11. The improvement set forth in claim 7 wherein said microprocessor is of the CMOS type and comprises a pair of terminals to which said external circuitry is connected, said individual resistance means each comprises a single discrete resistor, and each resistor is connected directly between said pair of terminals.

12. The improvement set forth in claim 11 wherein the single discrete resistor of said one resistance means has a resistance value which is substantially equal to that of the single discrete resistor of said other resistance means.

13. In a microprocessor-based control, one or more input means for delivering one or more input signals to the microprocessor, and one or more output means via which one or more output signals from the microprocessor exercises control over one or more aspects of a controlled means, and wherein the microprocessor is programmed to develop the one or more output signals in accordance with an algorithm which utilizes information derived from said one or more input signals, and the microprocessor comprises internal circuitry which is connected with external circuitry that includes the parallel circuit combination of a crystal and a starting resistance configured to initiate and sustain electrical oscillation of the combined circuitries and cause the generation of an internal clock signal within the microprocessor at a frequency related to said electrical oscillation, the improvement which comprises said starting resistance comprising two individual resistance means connected in parallel circuit relationship with each other and directly connected to said microprocessor internal circuitry, said two individual resistance means having respective resistance values which in their parallel circuit relationship connection are effective to cause the initiation of said electrical oscillation and which are also individually effective to cause the initiation of said electrical oscillation so that in the event that either one of said individual resistance means experiences an open circuit fault, said oscillation can nonetheless be initiated and sustained by the other of said individual resistance means.

14. The improvement set forth in claim 13 wherein said individual resistance means each comprises a single discrete resistor.

15. The improvement set forth in claim 14 wherein the single discrete resistor of said one resistance means has a resistance value which is substantially equal to that of the single discrete resistor of said other resistance means.

16. The improvement set forth in claim 13 wherein said one resistance means has a resistance value which is substantially equal to that of said other resistance means.

17. The improvement set forth in claim 13 wherein said microprocessor is of the CMOS type and comprises a pair of terminals to which said external circuitry is connected, said individual resistance means each comprises a single discrete resistor, and each resistor is connected directly between said pair of terminals.

18. The improvement set forth in claim 17 wherein the single discrete resistor of said one resistance means has a resistance value which is substantially equal to that of the single discrete resistor of said other resistance means.

* * * * *